US00RE41685E

(19) United States
(12) Reissued Patent
Feldman et al.

(10) Patent Number: US RE41,685 E
(45) Date of Reissued Patent: Sep. 14, 2010

(54) LIGHT SOURCE WITH NON-WHITE AND PHOSPHOR-BASED WHITE LED DEVICES, AND LCD ASSEMBLY

(75) Inventors: Alan Stuart Feldman, Phoenix, AZ (US); Brian David Cull, Massillon, OH (US); Dennis Michael Davey, Glendale, AZ (US)

(73) Assignee: Honeywell International, Inc., Morristown, NJ (US)

(21) Appl. No.: 11/788,399

(22) Filed: Apr. 19, 2007

Related U.S. Patent Documents

Reissue of:
(64) Patent No.: 6,666,567
Issued: Dec. 23, 2003
Appl. No.: 09/473,301
Filed: Dec. 28, 1999

(51) Int. Cl.
*G09F 13/04* (2006.01)
*F21V 9/00* (2006.01)
*F21S 4/00* (2006.01)

(52) U.S. Cl. ..... 362/237; 362/97.3; 362/231; 362/236; 362/249.02; 349/69; 349/70

(58) Field of Classification Search ..... 362/97, 362/228, 230, 231, 237, 249, 800, 240, 236, 362/249.02, 97.3; 349/69, 70
See application file for complete search history.

(56) References Cited

U.S. PATENT DOCUMENTS

| | | | | | |
|---|---|---|---|---|---|
| 2,850,563 | A | | 9/1958 | Gretener | |
| 3,794,828 | A | | 2/1974 | Arpino | |
| 3,805,065 | A | | 4/1974 | Williams | |
| 3,875,456 | A | | 4/1975 | Kano et al. | |
| 3,875,473 | A | | 4/1975 | Lebailly | |
| 4,677,533 | A | * | 6/1987 | McDermott et al. | 362/240 |
| 4,822,144 | A | * | 4/1989 | Vriens | 349/71 |
| 4,837,565 | A | * | 6/1989 | White | 345/46 |
| 4,946,259 | A | | 8/1990 | Matino et al. | |
| 4,992,704 | A | * | 2/1991 | Stinson | 315/312 |
| 5,008,788 | A | * | 4/1991 | Palinkas | 362/231 |
| 5,136,483 | A | * | 8/1992 | Schoniger et al. | 362/545 |
| 5,143,433 | A | * | 9/1992 | Farrell | 362/29 |

(Continued)

FOREIGN PATENT DOCUMENTS

| | | | |
|---|---|---|---|
| AU | 2004200183 | A1 | 2/2004 |
| EP | 1 234 140 | B1 | 8/2005 |
| JP | 09006260 | A | 1/1997 |
| JP | 2000208815 | | 7/2000 |
| JP | 2002198573 | | 7/2002 |
| JP | 2003179259 | | 6/2003 |
| WO | WO 01/36864 | A2 | 5/2001 |

*Primary Examiner*—Ismael Negron
(74) *Attorney, Agent, or Firm*—Alston & Bird LLP

(57) ABSTRACT

A light source incorporates *phosphor-based white* light emitting diodes (LEDs). The LEDs may be raised off the floor of the optical cavity to permit light to be emitted from the base of the LED. Additionally, a reflective protrusion may be placed beneath the raised LED to aid in redirecting light forward. The LEDs may be skewed in relation to adjacent LEDs to reduce interference. Non-white LEDs may be incorporated into the light source to permit for selective color tuning. Fluorescent lamps may also be implemented in combination with the LEDs to form a hybrid light source. *The light source may be used as a backlight for a liquid crystal display assembly.*

16 Claims, 10 Drawing Sheets

U.S. PATENT DOCUMENTS 5,164,715 A * 11/1992 Kashiwabara et al. ..... 345/4
5,365,411 A * 11/1994 Rycroft et al. ..... 362/20
5,375,043 A * 12/1994 Tokunaga ..... 362/601
5,384,519 A 1/1995 Gotoh
5,532,848 A 7/1996 Beretta
5,618,096 A * 4/1997 Parker et al. ..... 362/629
5,655,832 A * 8/1997 Pelka et al. ..... 362/296
5,661,578 A 8/1997 Habing et al.
5,726,862 A 3/1998 Huynh et al.
5,752,766 A * 5/1998 Bailey et al. ..... 362/250
5,807,122 A * 9/1998 Heeb et al.
5,813,752 A * 9/1998 Singer et al. ..... 362/293
5,813,753 A * 9/1998 Vriens et al. ..... 362/293
5,847,507 A 12/1998 Butterworth et al.
5,852,343 A 12/1998 Ravi et al.
5,924,785 A * 7/1999 Zhang et al. ..... 362/244
5,929,999 A 7/1999 Butterworth
5,934,798 A * 8/1999 Roller et al. ..... 362/497
5,962,971 A * 10/1999 Chen ..... 313/512
5,998,925 A 12/1999 Shimizu et al.
6,039,451 A * 3/2000 Grave ..... 362/225
6,139,166 A * 10/2000 Marshall et al. ..... 362/231
6,139,171 A * 10/2000 Waldmann ..... 362/494
6,144,424 A * 11/2000 Okuda et al. ..... 349/65
6,149,283 A * 11/2000 Conway et al. ..... 362/236
6,179,449 B1 * 1/2001 Chen ..... 313/501
6,234,648 B1 5/2001 Börner et al.
6,299,329 B1 * 10/2001 Mui et al. ..... 362/227
6,307,527 B1 * 10/2001 Youngquist et al. ..... 257/676
6,513,949 B1 2/2003 Marshall et al.
6,692,136 B2 2/2004 Marshall et al.
2004/0113568 A1 6/2004 Dowling et al.
2004/0212993 A1 10/2004 Morgan et al.
2005/0063194 A1 3/2005 Lys et al.

* cited by examiner

LIGHT SOURCE WITH NON-WHITE AND PHOSPHOR-BASED WHITE LED DEVICES, AND LCD ASSEMBLY

Matter enclosed in heavy brackets [ ] appears in the original patent but forms no part of this reissue specification; matter printed in italics indicates the additions made by reissue.

*Notice: More than one reissue application has been filed for the reissue of U.S. Pat. No. 6,666,567. The reissue applications are application Ser. No. 11/788,399 (the present application), Ser. No. 11/788,398 (filed concurrently herewith), and Ser. No. 11/316,597, all of which are divisional reissues of U.S. Pat. No. 6,666,567.*

BACKGROUND OF THE INVENTION

1. Technical Field

The present invention generally relates to lighting systems, and more particularly, to light sources implementing light emitting diodes (LEDs).

2. Background

Many industries and applications need backlighting to illuminate an information source. In particular, transmissive liquid crystal displays (LCDs) have become very popular in many electronic media. LCDs are useful in applications such as, but not limited to, displays in avionics, laptop computers, video cameras, and automatic teller machine displays. However, many LCDs require backlighting to illuminate the information being displayed.

Many systems perform the backlighting function in conventional displays. For example, one way to backlight an information source employs an array of conventional straight tubular fluorescent lamps. While these conventional lamps are inexpensive and do not require complex electronic controls, they are sometimes inadequate for particular applications. For instance, in avionics applications, the poor color quality of the phosphors and the short lamp life of these conventional lamps, among other shortcomings, limit their usefulness.

To avoid the various problems with conventional lamps, many manufacturers employ customized lamps, such as tubular serpentine lamps. Unlike conventional fluorescent lamp arrays, custom-made serpentine lamps commonly provide good color characteristics, light luminance uniformity, and long lamp life. These lamps are typically hand made, and consequently, are comparatively costly. Moreover, these lamps. are extremely fragile and difficult to install. Therefore, while custom-made tubular serpentine lamps may meet certain standards for the backlighting function, the high cost and fragility associated with these lamps detract from the advantages they offer.

A third alternative for backlighting information sources is flat fluorescent lamps. An exemplary flat fluorescent lamp, described in U.S. Pat. No. 5,343,116, issued Aug. 30, 1994, to Winsor, comprises a substrate fritted to a transparent cover lid, forming an enclosure. Diffuse channels are formed into the substrate in the interior of the enclosure. Standard phosphors are added to the interior of the enclosure which is further flushed with a material for emitting energy, such as argon or mercury. Energy is emitted in the form of visible light when an electric potential is introduced to the lamp by two electrodes, with one electrode placed at each end of the diffuse channel. Such lamps potentially offer greater ruggedness and lower manufacturing costs than serpentine tubular lamp alternatives. However, these lamps are still costly to manufacture and are difficult to repair.

Yet another alternative for backlighting information sources implements LEDs. The use of LEDs as light sources can be advantageous for several reasons. LEDs have a long life, which reduces the frequency for replacing non-functioning diodes. Further, when it is time to replace an LED, replacement is easier and more cost effective than when replacing a fluorescent light source. Additionally, LEDs are mechanically robust, i.e., they can typically withstand greater shocks and vibration than conventional fluorescent lights. Referring now to FIGS. 1 and 2, a conventional light source 100 incorporating LEDs comprises an optical cavity 102, multiple LEDs 104, a power source (not shown), and a diffuser 106 (FIG. 2). Optical cavity 102 has a floor 108 in the interior portion of light source 100 and an exterior surface 110.

As shown in FIG. 2, in conventional LED light systems, the LEDs 104 are attached directly to the floor 108 of the optical cavity 102. Referring to FIG. 3, LED 104 typically comprises a surface mount device constructed by encasing a diode 300 near the center of a small translucent rectangular block 302. Electrical contacts 304 and 306 at the ends of block 302 connect to the diode via a small lead frame 308.

Conventional LED lighting systems, however, fail to perform adequately for many backlighting applications, such as avionics, in which strict display performance requirements restrict their use. For example, LEDs typically use power less efficiently than conventional fluorescent lamps to produce comparable light intensity. Further, a conventional fluorescent lamp relies on phosphors which have narrowly defined spectral emission peaks that must be carefully controlled to provide repeatable color output. Control of the phosphor mixture to produce production-quality lamps requires significant investment of time and effort to maintain a uniform mixture, produce an acceptable color point, and ensure color purity based on phosphor chemistry. Moreover, in conventional white LEDs, the spectral emission is dominated by the blue spectral emission, and thus, the resulting "white" light is heavily shifted toward the blue spectrum. This shift limits the usefulness of LED light sources in backlighting applications.

SUMMARY OF THE INVENTION

A light source according to various aspects of the present invention comprises LEDs raised above the floor of the optical cavity. The raised LEDs may optionally have a protrusion under the LED for assisting in redirecting light. In another embodiment, adjacent LEDs may be skewed relative to one another to reduce absorption and reflection among the LEDs. In a further embodiment, non-white LEDs may be incorporated into the light source to permit selective color tuning. In an alternative embodiment, a hybrid light source may be created when fluorescent lamps are augmented with LEDs. These LEDs, which may optionally be raised above the floor of the optical cavity, may also optionally have a protrusion beneath. the raised LED.

BRIEF DESCRIPTION OF THE DRAWINGS

The subject matter of the invention is particularly pointed out and distinctly claimed in the concluding portion of the specification. The invention, however, both as to organization and method of operation, may best be understood by reference to the following description taken in conjunction with the claims and the accompanying drawings, in which like parts may be referred to by like numerals:

DETAILED DESCRIPTION OF THE EXEMPLARY EMBODIMENTS

The ensuing descriptions are preferred exemplary embodiments only, and are not intended to limit the scope, applicability, or configuration of the invention in any way. Rather, the ensuing descriptions provide a convenient description for implementing various exemplary embodiments of light sources according to various aspects of the present invention, it being understood that various changes may be made in the function and arrangement of elements described in the preferred embodiments without departing from the spirit and scope of the invention as set forth in the appended claims.

Figure 1:
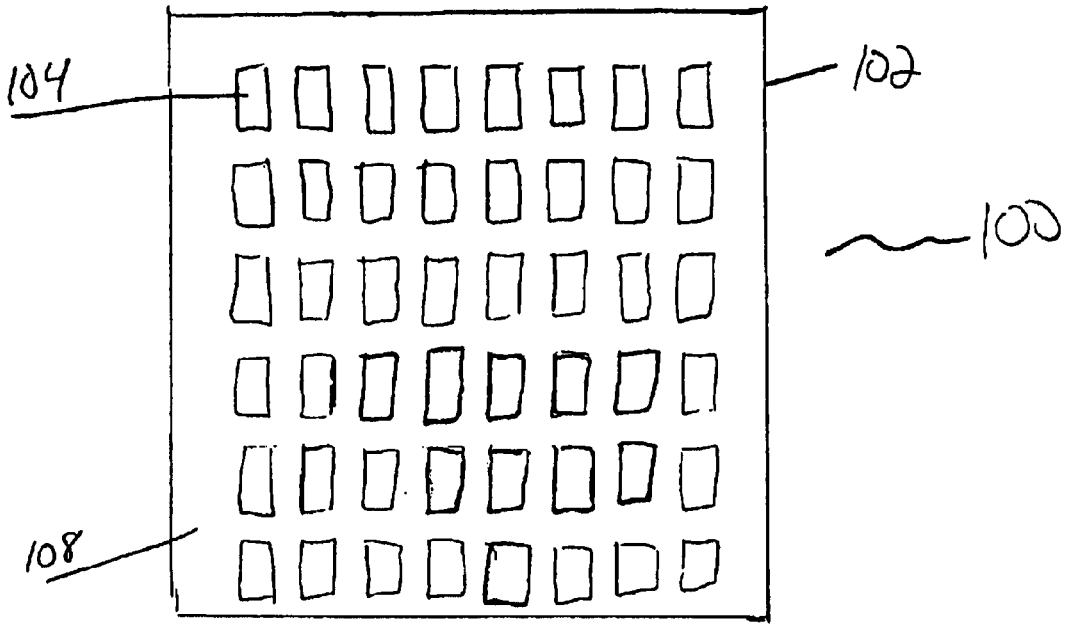
FIGURE 1 (Prior Art)
FIG. 1 is plan view of a prior art light source incorporating LED technology.
Figure 2:
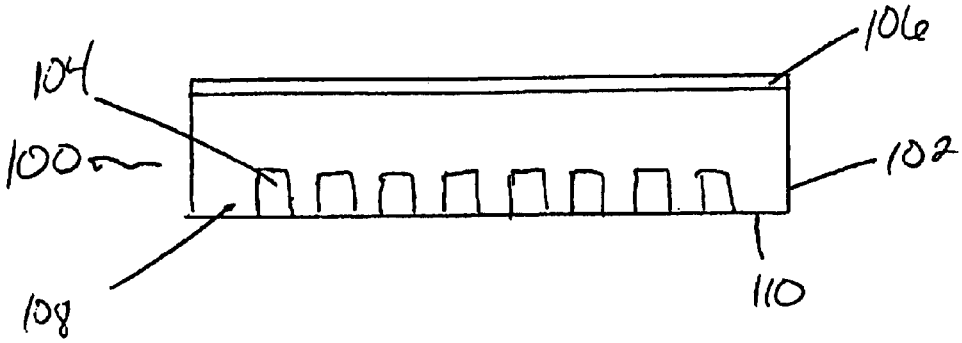
FIGURE 2 (Prior Art)
FIG. 2 is a side cross-sectional view of the light source of FIG. 1.
Figure 3:
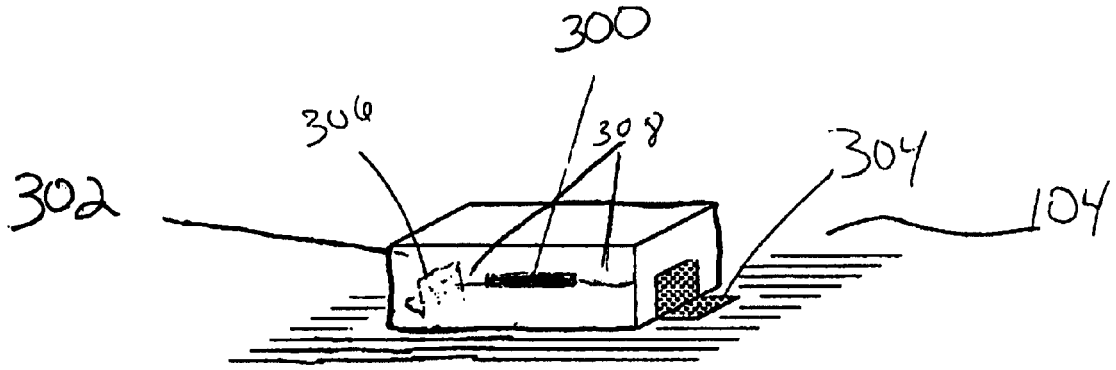
FIGURE 3 (PRIOR ART)
FIG. 3 is a perspective view of a conventional diode.
Figure 4:
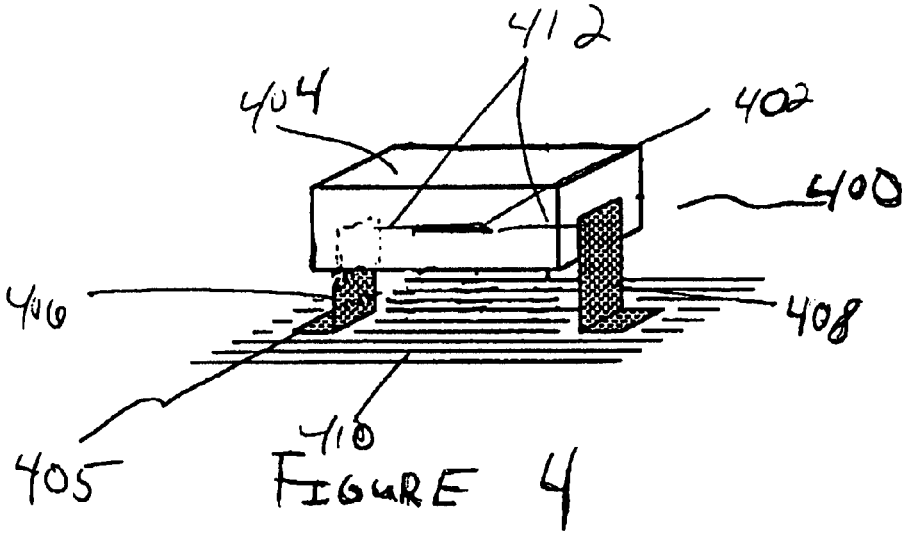
FIG. 4. is a perspective view of an elevated diode in accordance with an exemplary embodiment of the present invention.
Figure 5:
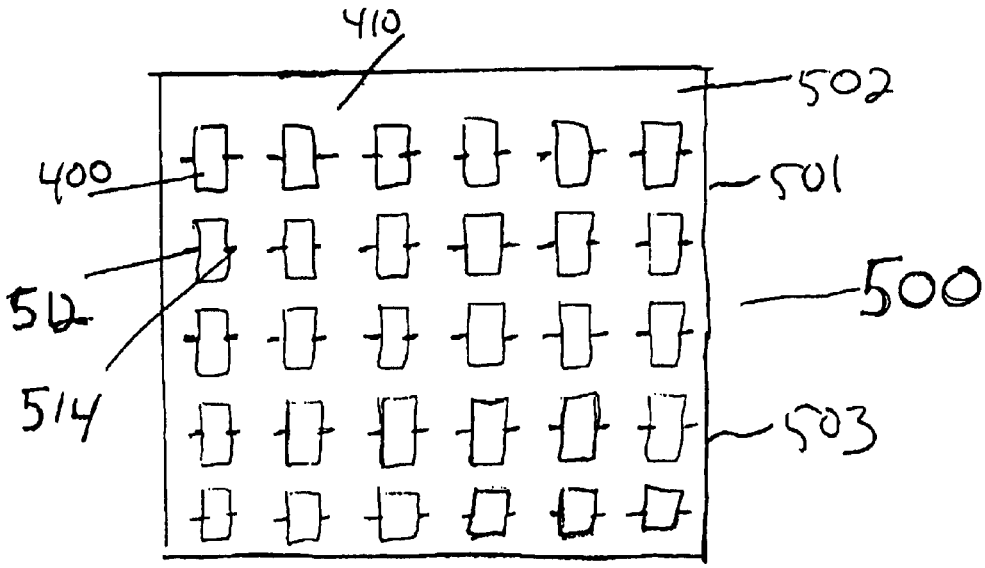
FIG. 5 is plan view of a light source implementing LEDs in accordance with an exemplary embodiment of the present invention.
Figure 6:
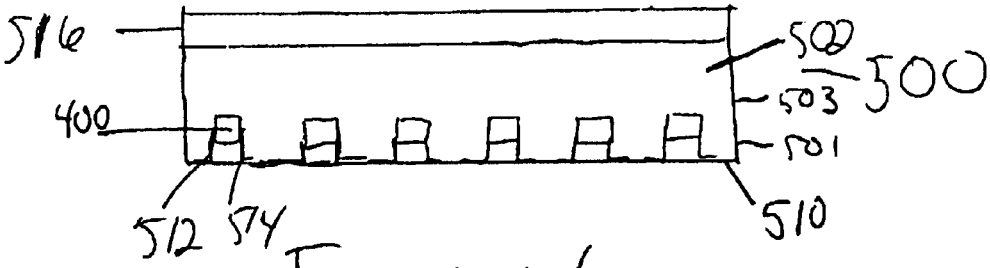
FIG. 6 is a side cross-sectional view of the light source of FIG. 5.

Referring now to FIGS. 4–6, a light source 500 in accordance with various aspects of the present invention implements an LED that is not flush with floor of the optical cavity. Raising LEDs 504 above the surface tends to capture rear-emitted light that is otherwise absorbed or otherwise lost, enabling the light source to emit more light without additional power. In the present embodiment, the light source 500 comprises: a housing 501 having a floor 410 and an exterior wall 503 forming an optical cavity 502; multiple LEDs 400; and a power source (not shown). The light source may further include a diffuser 516 (FIG. 6). Housing 501 may be constructed of any suitable material according to the criteria of the application, such as heat exposure, mechanical shock resistance, or cost. In the present embodiment, the housing 501 comprises aluminum, steel, glass, or ceramics, and defines the optical cavity 502. The optical cavity comprises any cavity defined in the housing in which light is to be dispersed. The floor 410 and or wall 503 may optionally be coated with a reflective material, for example, Duraflect™, expanded polytetrafluoroethylene, or any diffuse white paint such as a polyurethane paint. The floor 410 comprises any suitable base or surface for supporting the LEDs 400 or other relevant components.

The power source provides appropriate power supply and control to operate the lamp. The power source may provide power in any appropriate form, such as AC electrical current, and may control the power in any suitable manner, for example in conjunction with a voltage source with current limiting resistance, a constant current source, or a pulse width modulated current source, LED 400 may be any LED suitable for the application, such as a phosphor-based white LED sold by Nichia Corp, Tokushima, Japan. The color, type, configuration, performance, and other characteristics may be selected according to any appropriate criteria. In the present embodiment, LED 400 includes a diode 402 encased in a translucent rectangular package 404. The LED 400 is raised by a support system 405 such that the base of LED 400 is elevated above the floor 410 of optical cavity 502. For example, the support system 405 suitably comprises a pair of L-brackets 406 and 408 attached to either side of the LED 400 to support the LED 400 above the floor 410. L-brackets 406 and 408 may be affixed to floor 410 according to any suitable technique, such as by an adhesive, fastener or solder. Any support system 405 that raises the LED 400 above floor 410, for example, by using raised, a support matrix, or the like, may be used to support the LED 400.

The support system 405 may further connect the LED 400 to the power source. For example, in the present embodiment, the L-brackets 406 and 408 may be constructed of a suitable electrically conductive material that supports the, LED above the surface of the floor 410, such as copper or beryllium. A lead frame 412 electrically connects the diode 402 with L-brackets 406 and 408. L-brackets 406 and 408 are suitably connected to a printed circuit board which is connected to the power source, for example through control electronics.

Figure 7:
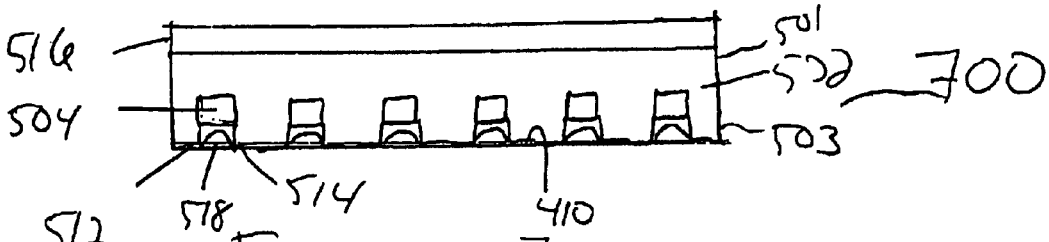
FIG. 7 is a side cross-sectional view of the light source of FIG. 5 having protrusions beneath the raised LEDs in accordance with a further embodiment of the present invention.

In configurations where LEDs 400 are raised above floor 410, as in FIGS. 5 and 6, the light output of the light source may be further accomplished by providing a reflective protrusion beneath the raised LEDs 504, further optimizing the recapture of emitted light. By placing the protrusions under the raised LEDs 504, a greater amount of light may be redirected forward, causing a greater light output without requiring a corresponding increase in power. Referring to the exemplary embodiment of FIG. 7, light source 700 has an optical cavity 502 above which LEDs 504 are mounted, suitably by L-brackets 512 and 514. Protrusions 518 are located approximately below LEDs 504. Protrusions 518 may be prepared in any suitable manner and shape, such as according to the desired application. For example, protrusions 518 may be prepared by stamping the floor 410 of the optical cavity 502 such that protrusions 518 form in the surface of the floor 410. Alternatively, protrusions 518 may be constructed by adding materials onto floor 410, for example, by placing droplets of an epoxy material onto floor 410 and then covering the surface of the epoxy with a reflective material. Protrusions 518 suitably have an approximately parabolic or semi-spherical shape that is convex relative to the floor 410 of optical cavity 502. Further, protrusions 518 may alternatively be shaped to direct in a predetermined direction. This configuration may be useful in applications having a narrow range of desired viewing angles for an associated display.

Figure 8:
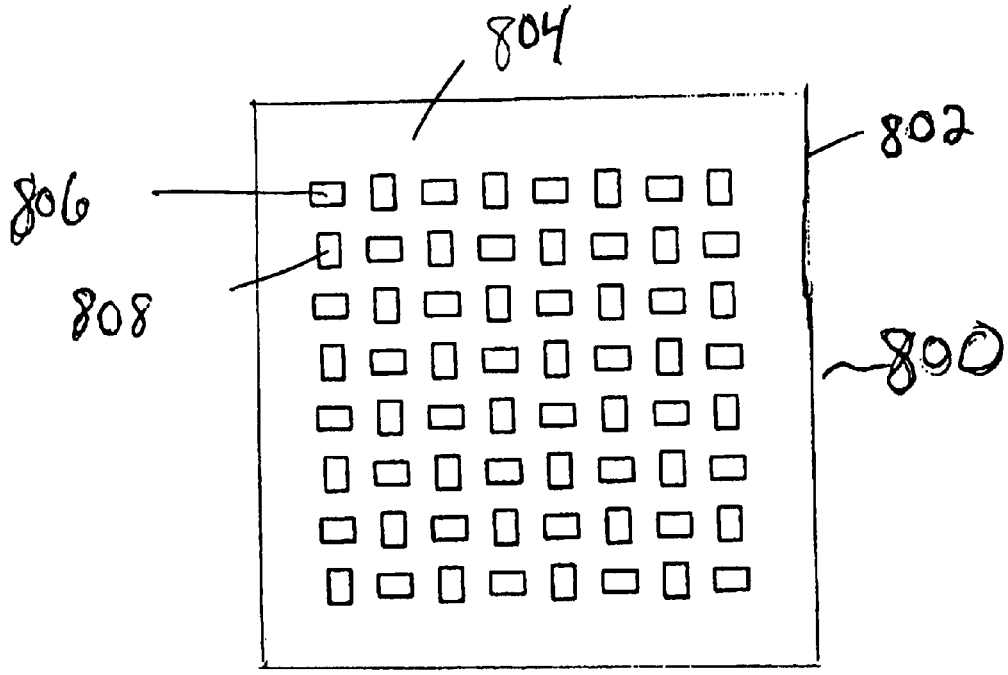
FIG. 8 is a plan view of a light source configuring LEDs in an orthogonal arrangement in accordance with an exemplary embodiment of the present invention.

In accordance with various aspects of the present invention, the light emitted by the light source may be further enhanced by arranging the LEDs in an array that reduces any absorptive or reflective effects of adjacent LEDs. For example, referring to FIG. 8, in accordance with a further embodiment of the present invention, a light source 800 has an optical cavity 802 with a floor 804. The longitudinal axes of a first set of LEDs are oriented in a first direction, such as horizontally 806, and those of a second set of LEDs are oriented in a second direction, such as vertically 808, such that they are perpendicular to one another. This orthogonal arrangement of adjacent LEDs, due to the relative placement of neighboring LEDs, tends to reduce the absorptive or reflective effect that adjacent LEDs may have on each other, permitting a greater light output without requiring an additional power input. Further, any or all of the LEDs may be mounted either directly onto floor 804, or alternatively, may be mounted above floor 804 as described above. Additionally, protrusions, as described above in accordance with FIG. 7, may be added to further enhance the recapture of rear-emitted light. Therefore, by skewing orientation of the LEDs relative to one another, the intensity of the light provided by the light source tends to increase without requiring a corresponding increase in power. Light output may be further enhanced by raising the LEDs above the optical cavity floor.

Figure 9:
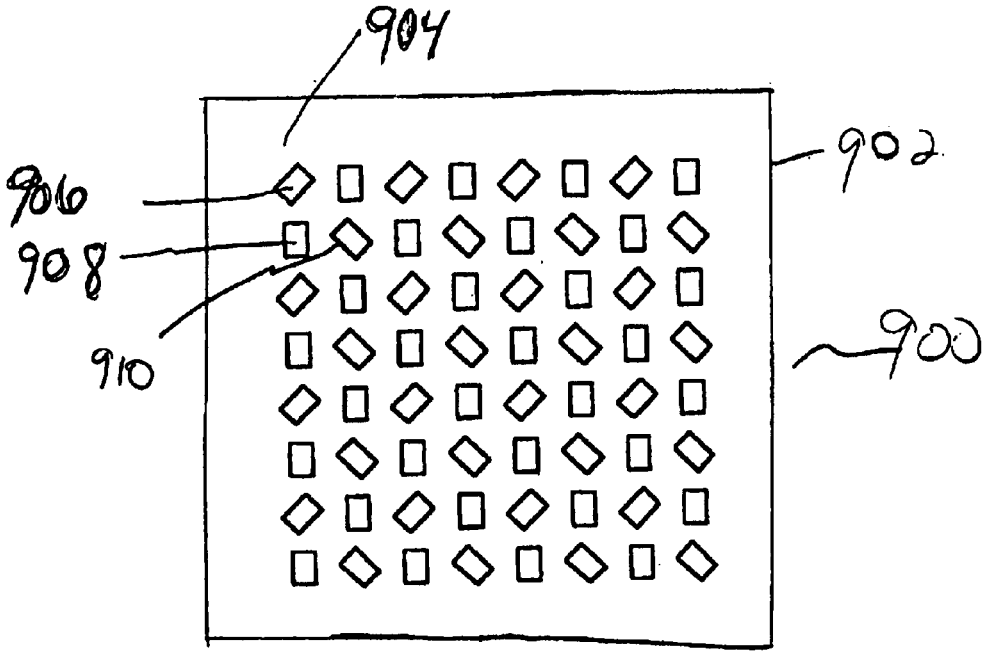
FIG. 9 is a plan view of a light source configuring LEDs in an oblique arrangement in accordance with an exemplary embodiment of the present invention.

Several variations in the orientation of the LEDs may be implemented to enhance light output. For example, referring now to FIG. 9, in accordance with yet another embodiment of the present invention, light source 900 has an optical cavity 902 with a floor 904. Three sets of LEDs are oriented in three different directions, such as vertically 908 and at approximately 45° from the vertical 906, 910. Due to the relative placement of neighboring LEDs, this oblique configuration also tends to reduce the absorptive or reflective effects of adjacent LEDs, yielding improved output without requiring additional power. Further, in accordance with other aspects of the present invention, any or all of the LEDs may be mounted either directly onto floor 904, or alternatively, may be mounted above floor 904 as described above. Additionally, protrusions, as described in accordance with FIG. 7, may be added to further enhance the recapture of rear-emitted light.

A light source according to various aspects of the invention may further be configured to exhibit improved spectral characteristics. In accordance with a further embodiment of the present invention, non-white LEDs, preferably, red, green, and blue LEDs, and more preferably red and green LEDs, may be incorporated into the light source as described and constructed in FIGS. 4–15 to enable it to have a tunable color output. Non-white LEDs, in particular red, green and blue LEDs may be any commercially available non-white LED.

The non-white LEDs may be configured in the light source in a variety of manners, including, but not limited to, clustering the different LED types together, and by laying down each color in separate rows. Further, non-white LEDs may be randomly dispersed throughout the light source with white LEDs, and may also be used in combination with fluorescent lamps as described below. The non-white LEDs may be mounted directly on the floor of the optical cavity, or as described in detail above, or they may be elevated above the optical cavity floor, and further, they may optionally be elevated above reflective protrusions as described above.

By incorporating non-white LEDs, multiple-wavelength LED light sources are introduced into a diffuse optical cavity to allow color mixing, with the purpose of increasing the color saturation of an LED-based backlight to increase its usefulness in lighting an LCD panel. These emission spectra allow tuning of the color balance of the backlight by actively driving the LEDs or selectively enhancing particular colors to achieve a desired balance. This tunability allows one LED backlight to be used with a wide variety of LCD panels possessing different combinations of color filters. It also allows active tuning of the color balance of an LED-based light source across the color spectrum, limited only by the saturation of the individual color elements comprising the backlight.

Figure 10:
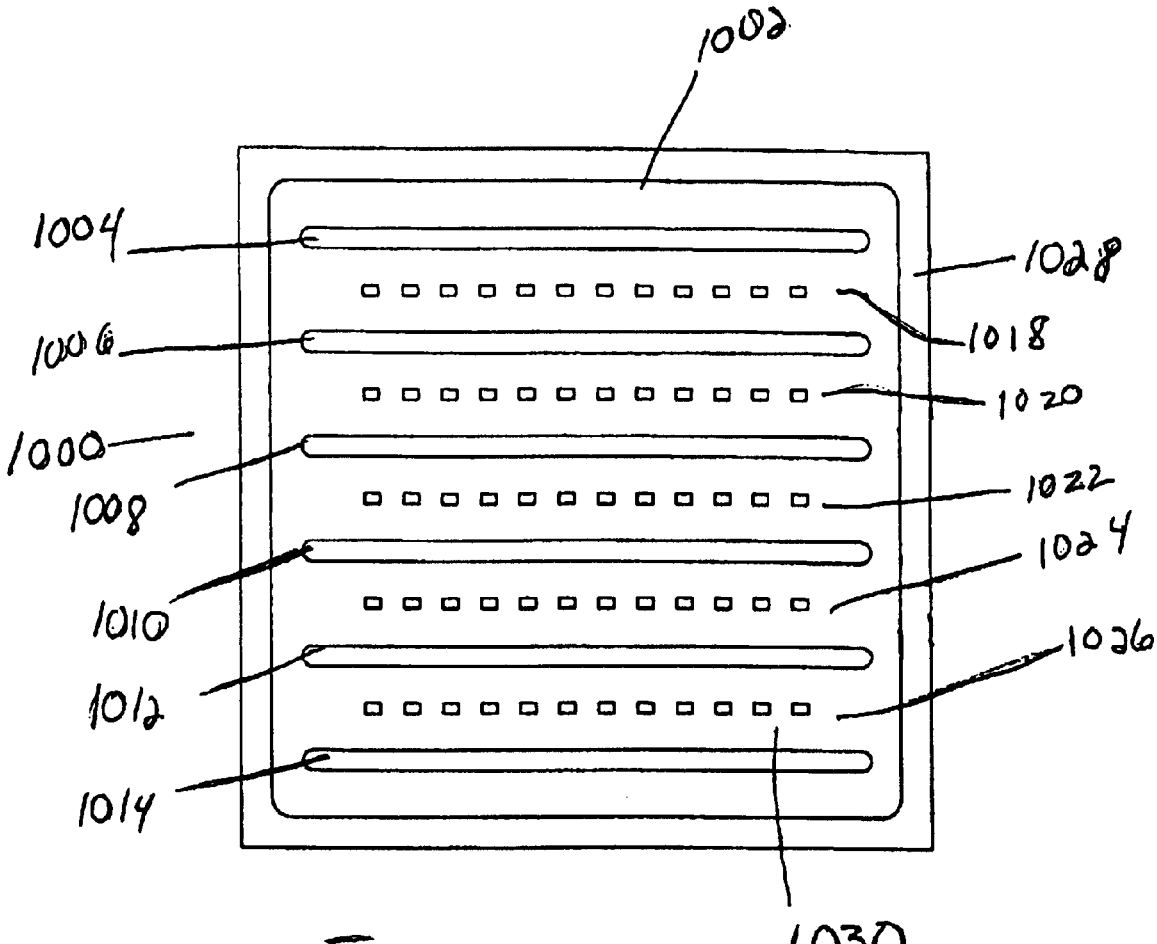
FIG. 10 is a plan view of a hybrid light source incorporating LEDs and tubular fluorescent lamps in accordance with an exemplary embodiment of the present invention.
Figure 11:
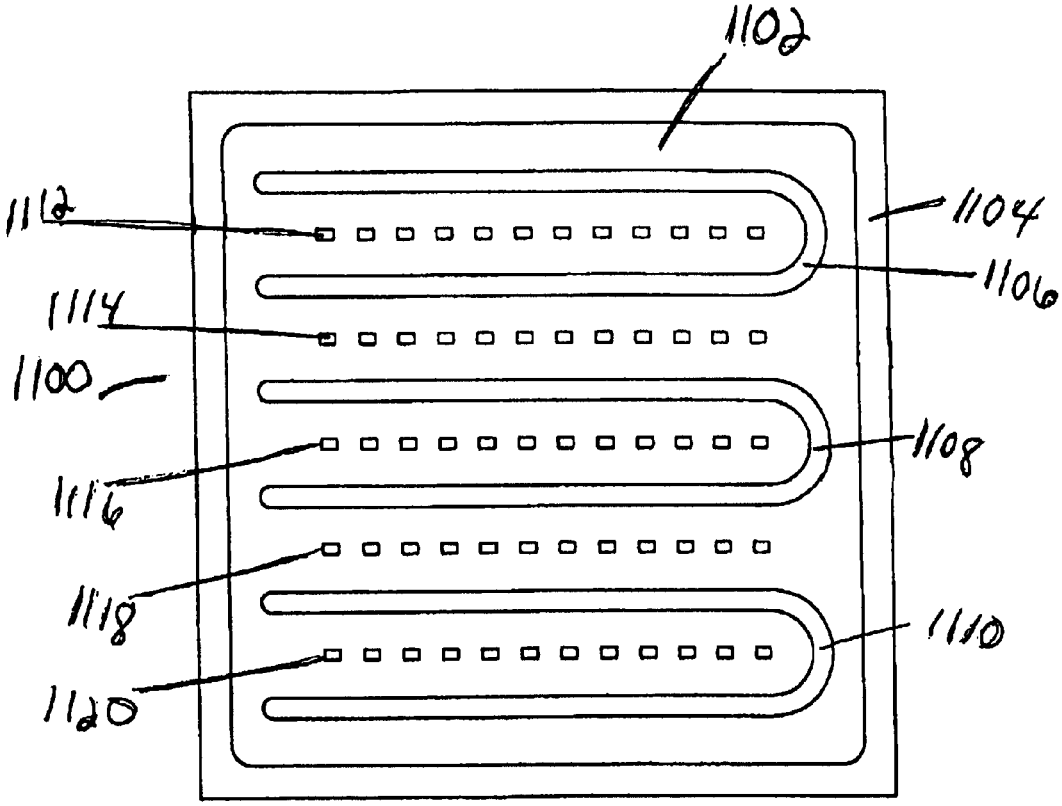
FIG. 11 is a plan view of a hybrid light source incorporating LEDs and U-shaped fluorescent lamps in accordance with an exemplary embodiment of the present invention.
Figure 12:
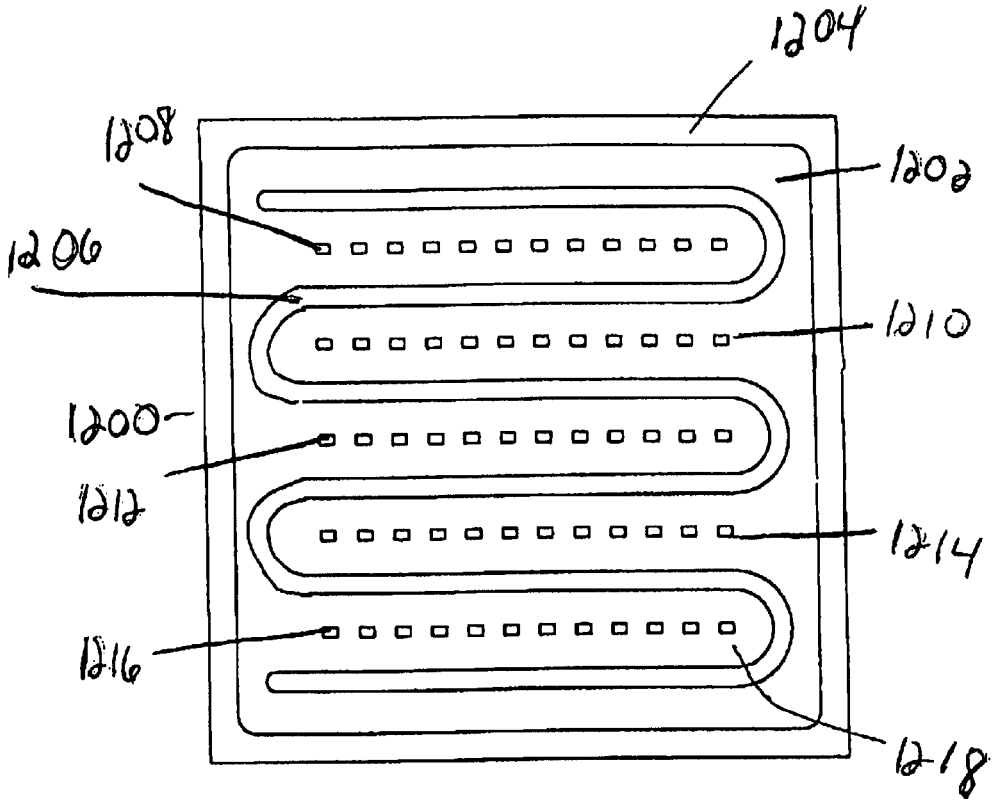
FIG. 12 is a plan view of a hybrid light source incorporating LEDs and a serpentine fluorescent lamp in accordance with an exemplary embodiment of the present invention.

To exploit the advantages of both LEDs and fluorescent light sources, a hybrid light source may incorporate both LEDs and fluorescent lights. Referring to FIG. 10, in accordance with an exemplary embodiment according to various aspects of the present invention, a light source 1000 has an optical cavity 1002 containing alternating rows of tubular fluorescent lamps and LEDs. An optional reflective cavity 1028 may be added to the light source to further enhance light output. In accordance with this exemplary embodiment, six tubular fluorescent lamps 1004, 1006, 1008, 1010, 1012, and 1014 are arranged in a parallel configuration within the optical cavity 1002. The fluorescent lamps may be mounted in any suitable manner, for example, by using a support to mount the fluorescent lamp in optical cavity 1002. Fluorescent lamps 1004, 1006, 1008, 1010, 1012, and 1014 may be any commercially available tubular fluorescent lamp. These lamps may be either hot cathode or cold cathode lamps and may have a variety of shapes, including, but not limited to, straight, U-shaped (e.g., as elements 1106, 1108, and 1110 are illustrated in the exemplary embodiment shown in FIG. 11), and serpentine fluorescent lamps (e.g., as element 1206 is illustrated in the exemplary embodiment shown in FIG. 12).

LEDs may be interspersed among the fluorescent lamps in a variety of configurations in the hybrid light source. As seen in FIG. 10, rows of LEDs 1018, 1020, 1022, 1024, and 1026 are alternated in between the fluorescent lamps 1004, 1006, 1008, 1010, 1012, and 1014. LEDs may be white LEDs, non-white LEDs, or may be a mixture of both white and non-white LEDs as described above. Further, the LEDs may be mounted directly to the floor 1030 of the optical cavity 1002, or may be mounted above the optical cavity 1002 as shown in FIG. 4, and may further be mounted over reflective protrusions as described above. Further, the LEDs may be mounted in skewed directions relative to adjacent LEDs as described in FIGS. 8 and 9.

It should be appreciated that the present invention is not limited to the configurations described above. For example, referring to FIGS. 13–15, various alternative embodiments may include an edge-lit configuration, i.e., light floods the cavity from the sides and is randomly reflected. In the edge-lit configurations, the LEDs suitably face into the cavity, and not toward the view.

Figure 13:
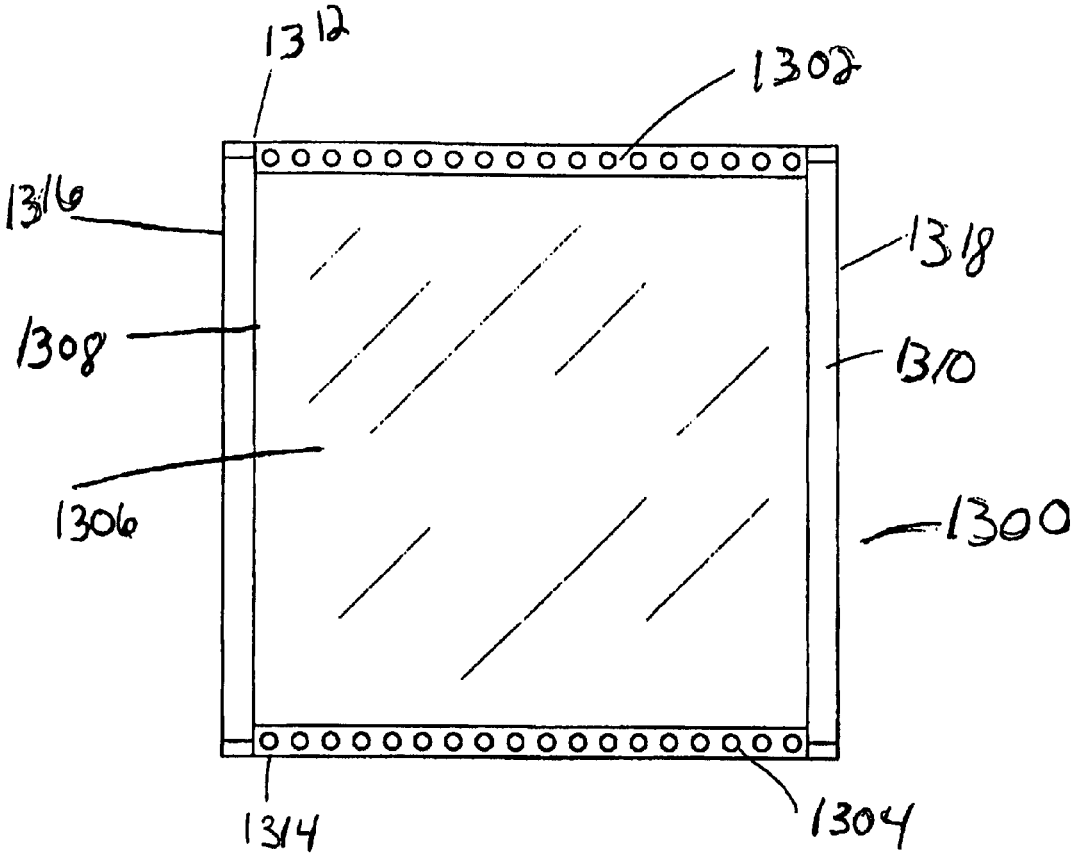
FIGS. 13–15 are plan views of further embodiments of hybrid light source configurations in accordance with various aspects of the present invention.
Figure 14:
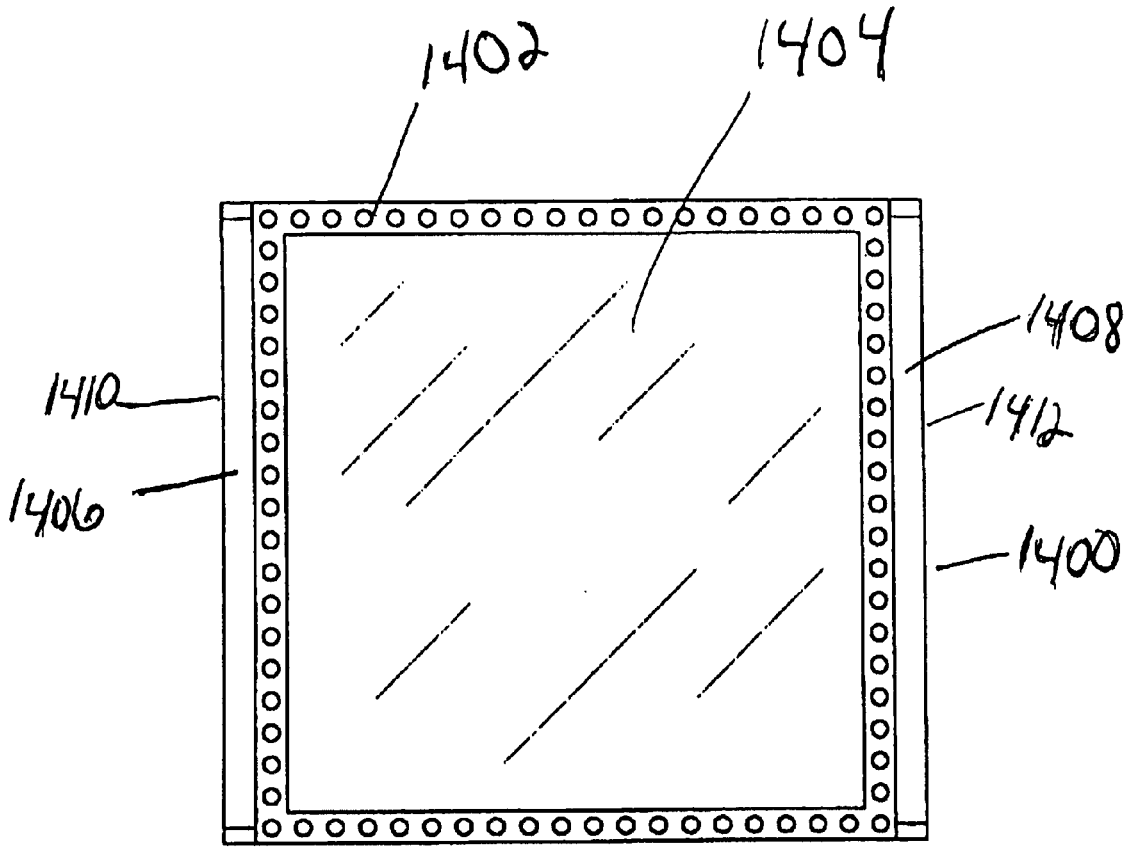
Figure 15:
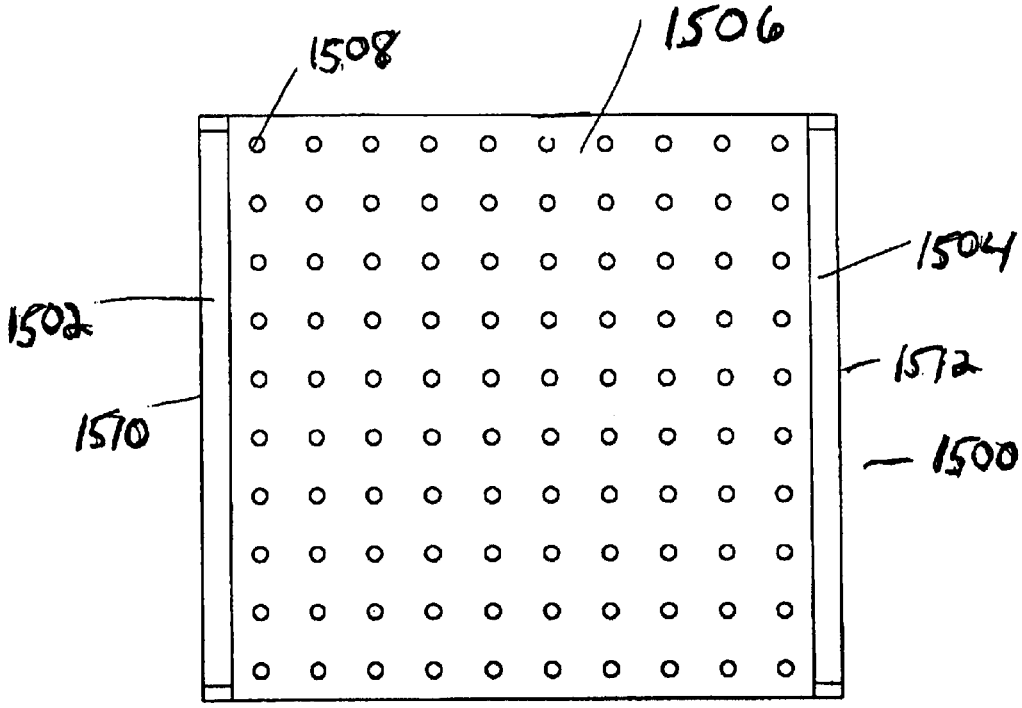

Referring now to FIGS. 13 and 14, these figures illustrate light source embodiments having the illumination sources around the perimeter of the lamp. In FIG. 13, light source 1300 has LED rows 1302 and 1304 on opposite sides 1312 and 1314 of optical cavity 1306. Fluorescent lamps 1308 and 1310 are also located on opposite sides 1316 and 1318 of optical cavity 1308. In FIG. 14, light source 1400 has LEDs 1402 around the perimeter of optical cavity 1404. Fluorescent lamps 1406 and 1408 are on opposite side 1410 and 1412 of optical cavity 1404 The LEDs 1302, 1304 and 1402 of FIGS. 13 and 14 may be in a variety of orientations, including skewed relative to one another, raised from the optical cavity surface, and having a protrusion under the elevated LED. Further, a variety of LED color combinations may be implemented to permit selective color tuning Referring now to FIGS. 13 and 14, these figures illustrate light source embodiments having the illumination sources around the perimeter of the lamp. In FIG. 13, light source 1300 has LED rows 1302 and 1304 on opposite sides 1312 and 1314 of optical cavity 1306. Fluorescent lamps 1308 and 1310 are also located on opposite sides 1316 and 1318 of optical cavity 1306. In FIG. 14, light source 1400 has LEDs 1402 around the perimeter of optical cavity 1404. Fluorescent lamps 1406 and 1408 are on opposite side 1410 and 1412 of optical cavity 1404. The LEDs 1302, 1304 and 1402 of FIGS. 13 aid 14 may be in a variety of orientations, including skewed relative to one another, raised from the optical cavity surface, and having a protrusion under the elevated LED. Further, a variety of LED color combinations may be implemented to permit selective color tuning.

It should be appreciated that in all embodiments of the present invention any number of LEDs and fluorescent lamps may be used according to the particular application or design criteria of the backlight or the display. As such, the drawing figures and the present description are only meant to illustrate exemplary embodiments in accordance with the present invention and are not intended to limit the invention to the configurations illustrated herein.

Thus, a light source incorporating LEDs and fluorescent lamps according to various aspects of the present invention provides several features and advantages, such as light output uniformity. In addition, the above descriptions are preferred exemplary embodiments only, and are not intended to be limiting in any way. Various modifications, substitutions, and other applications of the present embodiments may be made without departing from the spirit and the scope of the invention as set forth in the appended claims.

What is claimed is:

1. A light source, comprising:

an optical cavity having a floor;

at least one light emitting diode (LED) having a top and a bottom coupled to said floor such that said bottom of said at least one light emitting diode is elevated above said floor of said optical cavity; and a reflective protrusion located below said at least one LED.

2. A light source comprising:

an optical cavity having a floor;

at least one fluorescent lamp coupled to said optical cavity; and at least two LEDs coupled to said optical cavity, wherein adjacent said at least two LEDs are skewed at approximately 45° relative to one another.

3. A light source comprising:

an optical cavity having a floor;

at least one fluorescent lamp coupled to said optical cavity; and at least two LEDs coupled to said optical cavity, wherein adjacent said at least two LEDs are perpendicular to one another.

4. A light source comprising:

an optical cavity having a floor;

at least one fluorescent lamp coupled to said optical cavity; and at least one LED coupled to said optical cavity, wherein said at least one LED is coupled with said optical cavity such that said LED is elevated from said floor of said optical cavity.

5. A light source according to claim 4 further comprising a protrusion on said floor positioned beneath said elevated LED.

6. A light source comprising:

an optical cavity having a floor;

at least two fluorescent lamps coupled to said optical cavity; and at least one LED coupled to said optical cavity, wherein two of said fluorescent lamps are located at opposing sides of said optical cavity, and said LEDs are located at intervals around substantially the perimeter of said optical cavity.

7. A method of manufacturing a light source comprising the steps of:

providing an optical cavity having a floor;

mounting at least one LED having a top and bottom in said optical cavity such that said bottom of said LED is elevated above said floor of said optical cavity; and providing a protrusion below said at least at one LED.

8. A method of manufacturing a light source comprising the steps of:

providing an optical cavity having a floor;

mounting at least one LED having a top and bottom in said optical cavity such that said bottom of said LED is elevated above said floor of said optical cavity; and mounting at least one fluorescent lamp in said optical cavity.

9. A light source comprising:

an optical cavity having a floor;

a plurality of fluorescent lamps coupled to said optical cavity substantially parallel to one other; and a plurality of LEDs coupled to said optical cavity interspersed among said fluorescent lamps, wherein said plurality of LEDs are coupled to said optical cavity, said plurality of LEDs having tops and bottoms and being coupled to said optical cavity such that said bottoms of said LEDs are elevated above said floor.

*10. A light source comprising:*

*an optical cavity;*

*a plurality of first light-emitting diodes each of which is a phosphor light-emitting diode that emits white light, each first light-emitting diode comprising a diode encased in a light-transmitting package;*

*a plurality of second light-emitting diodes each of which emits non-white light, each second light-emitting diode comprising a diode encased in a light-transmitting package;*

*wherein the first and second light-emitting diodes are arranged to emit light into the optical cavity such that mixing of spectral outputs from the first and second light-emitting diodes occurs in the optical cavity.*

*11. A light source of claim 10, further comprising at least one third light-emitting diode having a spectral output different from those of the first and second light-emitting diodes.*

*12. A light source of claim 11, wherein the spectral output of the second light-emitting diodes is a red output.*

*13. A light source of claim 11, wherein the spectral output of the third light-emitting diode is a green output.*

*14. A light source of claim 13, further comprising at least one fourth light-emitting diode having a blue output.*

*15. A liquid crystal display assembly comprising:*

*a backlight including:*

*an optical cavity;*

*a plurality of first light-emitting diodes each of which is a phosphor light-emitting diode that emits white light, each first light-emitting diode comprising a diode encased in a light-transmitting package;*

*a plurality of second light-emitting diodes each of which emits non-white light, each second light-emitting diode comprising a diode encased in a light-transmitting package;*

*wherein spectral outputs of the first and second light-emitting diodes are operative to tune a color balance of the backlight;*

*wherein the first and second light-emitting diodes are arranged to emit light into the optical cavity such that mixing of the spectral outputs from the first and second light-emitting diodes occurs in the optical cavity; and*

*a liquid crystal display panel positioned adjacent to the backlight so as to be illuminated by the backlight.*

*16. A liquid crystal display assembly of claim 15, further comprising at least one filter that is configured to be used with the liquid crystal display panel and the backlight.*

* * * * *